(12) United States Patent
Fujita et al.

(10) Patent No.: US 10,199,201 B2
(45) Date of Patent: Feb. 5, 2019

(54) PLASMA SOURCE

(71) Applicant: NISSIN ION EQUIPMENT CO., LTD., Kyoto-shi, Kyoto (JP)

(72) Inventors: Hideki Fujita, Kyoto (JP); Suguru Itoi, Kyoto (JP)

(73) Assignee: NISSIN ION EQUIPMENT CO., LTD., Kyoto-shi, Kyoto (JP)

(*) Notice: Subject to any disclaimer, the term of this patent is extended or adjusted under 35 U.S.C. 154(b) by 0 days.

(21) Appl. No.: 15/902,009

(22) Filed: Feb. 22, 2018

(65) Prior Publication Data

US 2018/0374676 A1 Dec. 27, 2018

(30) Foreign Application Priority Data

Jun. 23, 2017 (JP) ................................ 2017-123084

(51) Int. Cl.
*H05B 31/26* (2006.01)
*H01J 37/317* (2006.01)
*H01J 37/32* (2006.01)

(52) U.S. Cl.
CPC ...... *H01J 37/3171* (2013.01); *H01J 37/3222* (2013.01); *H01J 37/3244* (2013.01); *H01J 37/32467* (2013.01); *H01J 37/32532* (2013.01)

(58) Field of Classification Search
CPC ....... H05H 1/46; H05H 1/24; H01J 37/32082; H01J 37/32192; H01J 37/32174; H01J 37/32623; H01J 37/08; H01J 37/3171; H01J 27/18; H01J 27/08; H01J 27/14; H01J 41/04; H01J 41/14; H01J 41/06; B82Y 10/00; H01T 23/00; H01T 19/00
See application file for complete search history.

(56) References Cited

U.S. PATENT DOCUMENTS

2014/0021861 A1* 1/2014 Carducci .................. H05H 1/46
 315/111.51
2016/0372306 A1* 12/2016 Voronin ............... H01J 37/3211

FOREIGN PATENT DOCUMENTS

JP 08-031358 A 2/1996

* cited by examiner

*Primary Examiner* — Minh D A
(74) *Attorney, Agent, or Firm* — Sughrue Mion, PLLC

(57) ABSTRACT

A plasma source is provided. The plasma source includes a chamber body, a supply passage, a vacuum connector, an antenna, a first insulator, a second insulator, and a conductor. The chamber body has an opening for emitting ions or electrons. The supply passage penetrates through a first peripheral wall of the chamber body. The vacuum connector is provided in a second peripheral wall of the chamber body at a position opposed to the opening. The antenna has a base end connected to the vacuum connector, and extends inside the chamber body toward the opening. The first insulator covers a first region of the antenna at a distal end of the antenna inside the chamber body. The second insulator covers a second region of the antenna at the base end of the antenna inside the chamber body. The conductor covers the second insulator.

20 Claims, 5 Drawing Sheets

PLASMA SOURCE

CROSS-REFERENCE TO RELATED APPLICATION

This application claims priority to Japanese Patent Application No. 2017-123084, filed on Jun. 23, 2017 in the Japanese Patent Office, the disclosure of which is incorporated by reference herein in its entirety.

BACKGROUND

Apparatuses and devices consistent with the present disclosure relate to plasma sources.

A plasma source is used to produce ions in an ion implanter technology. The plasma source may, in some cases, have structures such as an antenna inside a plasma generation chamber, and these structures tend to cause the plasma to have different densities at different locations throughout the plasma generation chamber. This leads to difficulties in producing a plasma source with a high ion or electron extraction efficiency.

SUMMARY

It is an aspect to provide a plasma source having a high ion or electron extraction efficiency.

According to an aspect of an exemplary embodiment, there is provided a chamber body having an opening for emitting ions or electrons; a gas supply passage penetrating through a first peripheral wall of the chamber body; a vacuum connector provided in a second peripheral wall of the chamber body; an antenna having a base end connected to the vacuum connector, and extending inside the chamber body toward the opening; a first insulator covering a first region of the antenna at a distal end of the antenna inside the chamber body; a second insulator covering a second region of the antenna at the base end of the antenna inside the chamber body; and a conductor covering the second insulator.

According to an aspect of an exemplary embodiment, there is provided a plasma source comprising a chamber body having an opening for emitting ions or electrons, and a wall opposite to the opening, a chamber being defined between the wall and the opening; a gas supply passage penetrating through the wall; a vacuum connector provided in the wall and having a portion extending into the chamber; an antenna connected to the vacuum connector, and having an extension portion that extends into the chamber; a first insulator covering a distal end of the extension portion of the antenna; a second insulator covering a proximal end of the extension portion of the antenna between the wall and the first insulator; and a conductor coaxially covering the second insulator.

BRIEF DESCRIPTION OF THE DRAWINGS

The above and/or other aspects will become more apparent to those of ordinary skill in the art by describing exemplary embodiments thereof in detail with reference to the accompanying drawings, in which.

DETAILED DESCRIPTION

There has been proposed an ion/radical source comprising a plasma generation chamber, a gas introduction section for introducing gas into the plasma generation chamber, an antenna disposed within the plasma generation chamber, and an extraction electrode disposed adjacent to an opening for emitting therethrough ions or radicals in the plasma generation chamber toward the outside of the plasma generation chamber. Such an ion/radical source is shown, for example, in JP H08-031358A. In this ion/radical source, the antenna has a base end fixed to an inner wall surface defining the plasma generation chamber, at a position opposed to the opening, and a distal end protruding toward the opening.

In the conventional ion/radical source having a configuration described above, the density of plasma generated around the based end of the antenna in the plasma generation chamber becomes relatively high. On the other hand, an ion or electron generated at a position more distant from the opening in the plasma generation chamber tends to have greater deterioration in extraction efficiency during operation of extracting the ion or electron to the outside of the plasma generation chamber through the opening by the extraction electrode. Thus, if the density of plasma in the plasma generation chamber exhibits a distribution in which the plasma density becomes higher around the base end of the antenna relatively distant from the opening, the efficiency of extraction of ions or electrons to the outside of the plasma generation chamber will be deteriorated accordingly.

With reference to the drawings, a plasma source according to various exemplary embodiments will now be described. For example, the plasma source may include a first insulator member covering a first region of an antenna located inside a chamber body and on the side of a distal end of the antenna; a second insulator member covering a second region of the antenna located inside the chamber body and on the side of a base end of the antenna; and a conductor member covering the second insulator member. In this plasma source, plasma is generated inside the chamber body by introducing a microwave into the chamber body via the antenna. In this process, the conductor member provided in the above manner makes it possible to reduce the density of plasma to be generated inside the chamber body in a region around the second region of the antenna, and increase the density of plasma to be generated inside the chamber body in a region closer to an opening of the chamber body than that around the second region inside the chamber body.

Figure 1:
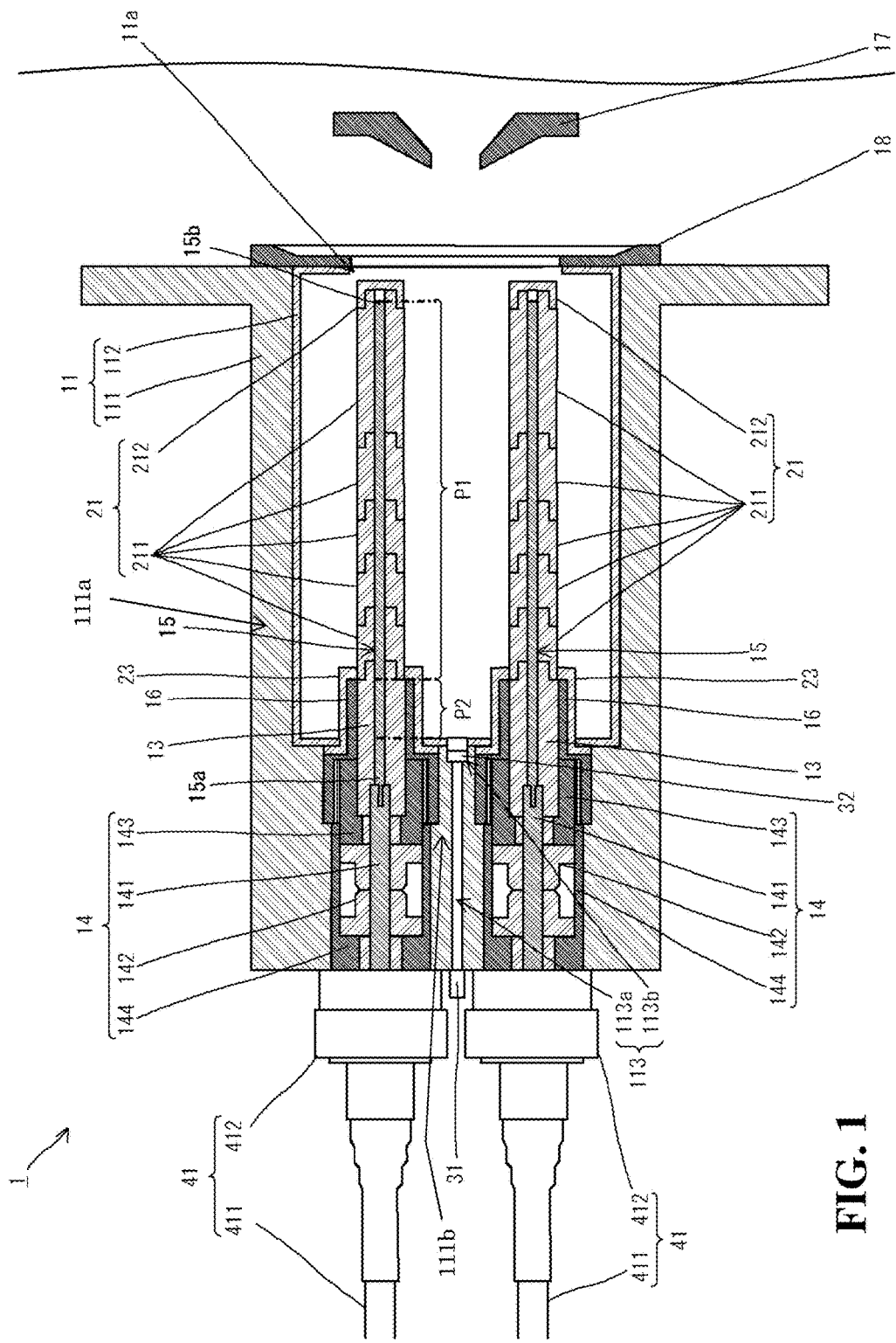
FIG. 1 is a sectional view of a plasma source according to an exemplary embodiment.

As depicted in FIG. 1, a plasma source 1 according an exemplary embodiment comprises a chamber body 11, a gas introduction section 31 for introducing gas into the chamber body 11 via a supply passage 113, two vacuum connectors 14, and two antennas 15. Each of the two antennas 15 have a base end 15a connected a respective one of the vacuum connectors 14. The plasma source 1 also comprises an extraction electrode 17 for extracting ions or electrons generated inside the chamber body 11, to an outside of the chamber body 11, and a slit member 18 covering an opening 11a of the chamber body 11. Further, the plasma source 1 comprises a first insulator member 21 covering a first region P1 of each of the antennas 15 on the side of a distal end 15b of the antenna 15, a second insulator member 13 covering a second region P2 of each of the antennas 15 on the side of the base end 15a (i.e., a proximal end) of the antenna 15, and a conductor member 16 covering the second insulator member 13. Each of the vacuum connectors 14 has one end to which the antenna 15 is connected, and another end to which a coaxial cable 41 is connected. The coaxial cable 41 comprises a cable 411, and a plug 412 provided at one end of the cable 411. The coaxial cable 41 is connected to a microwave source (not depicted), whereby a microwave is supplied from the microwave source to the antenna 15 via the coaxial cable 41. For example, the microwave may have a frequency of 2.45 GHz.

The chamber body 11 is a bottomed, circular tubular container-like body, and has an opening 11a for emitting therethrough ions or electrons generated inside the chamber body 11, toward the outside of the chamber body 11. The chamber body 11 comprises a peripheral wall 111 formed from a metal material. The peripheral wall 111 may include a first peripheral wall portion 111a that is a cylindrical side wall and a second peripheral wall portion 111b that is a base wall located at a position opposite from the opening 11a of the chamber body 11. The first peripheral wall portion 111a and the second peripheral wall portion 111b may be formed together as a single body from one piece of metal, or may be formed separately and then attached together by wielding, bolting, etc. The chamber body 11 further comprises an insulator layer 112 provided on an inner wall surface of the peripheral wall 111. The insulator layer 112 is formed from a ceramic material such as Al2O3 (alumina), BN (boron nitride) or AlN (aluminum nitride). By providing the insulator layer 112 in the above manner, it becomes possible to prevent the peripheral wall 111 of the chamber body 11 from being exposed to plasma generated inside the chamber body 11, and thus prevent a situation where metal atoms of the inner wall surface of the peripheral wall 111 of the chamber body 11 are sputtered and released to the outside of the chamber body 11.

The two vacuum connectors 14 are buried in the peripheral wall 111 of the chamber body 11 at a position opposed to the opening 11a, e.g., in the second peripheral wall portion 111b of the peripheral wall 111 of the chamber body 11. While FIG. 1 shows the vacuum connectors 14 and antennas 15 in the peripheral wall 111 at a position opposed to the opening 11a, this is only an example. In some exemplary embodiments, the vacuum connectors and antennas may be located in a different position from the position opposed to the opening, for example, in the first peripheral wall 111a. The peripheral wall 111 of the chamber body 11 is formed with a supply passage 113 for supplying gas from the outside of the chamber body 11 into the chamber body 11.

The supply passage 113 penetrates through the peripheral wall 111, and an inside of the supply passage 113 communicates with the inside of the chamber body 11 (i.e., with a chamber defined by the chamber body 11). In FIG. 1, the supply passage 113 is shown in the second peripheral wall portion 111b. However, this is only an example and in some exemplary embodiments, the supply passage 113 may be formed in the first peripheral wall portion 111a.

Figure 2A:
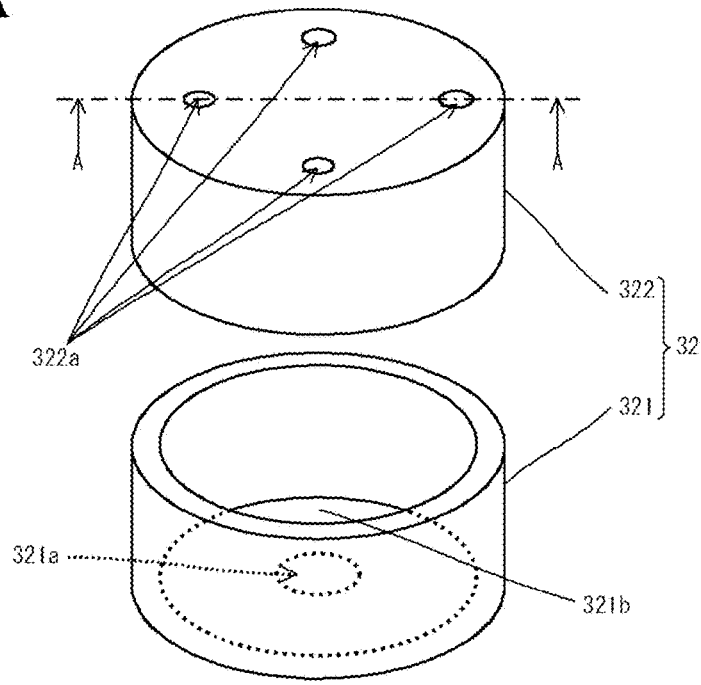
FIGS. 2A and 2B are, respectively, an exploded perspective view and a sectional view of a fitted member of the plasma source of FIG. 1.
Figure 2B:
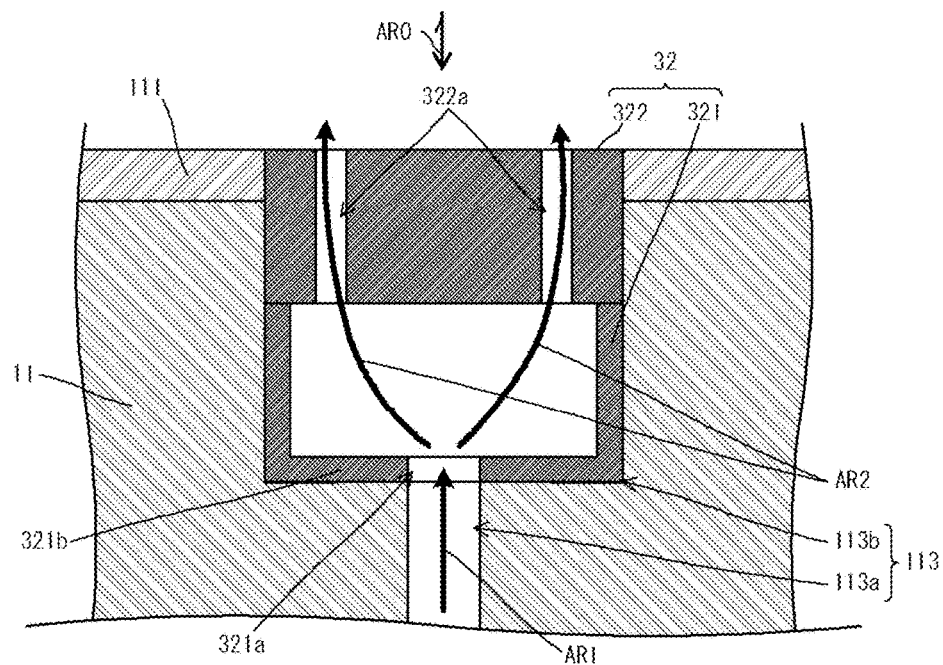

The supply passage 113 has a main portion 113a, and a broadened portion 113b which is formed at one end of the supply passage 113 on the side opposite from the gas introduction section 31, and is broader than the main portion 113a. For example, a diameter of the broadened portion 113b is larger than a diameter of the main portion 113a. Further, a fitted member 32 is fittingly inserted into the broadened portion 113b. As depicted in FIGS. 2A and 2B, the fitted member 32 comprises a first member 321 and a second member 322. The first member 321 is a bottomed, circular tubular member whose bottom wall 321b is provided with an inlet port 321a for enabling gas supplied from the gas introduction section 31 to flow into the fitted member 32 therethrough. The second member 322 is a circular disc-shaped member which is provided with at least one outlet port 322a (in FIGS. 2A and 2B, four outlet ports 322a are shown) for enabling the gas flowing into the first member 321 to flow out of the fitted member 32 therethrough. It should be noted that in the example shown in FIGS. 2A and 2B, four outlet ports 322a are provided. However, this is only an example, and in some exemplary embodiments, only one outlet port 322a may be provided. In other exemplary embodiments, two or three outlet ports 322a may be provided, or more than four may be provided. In other words, the number of outlet ports 322a is not particularly limited.

That is, the fitted member 32 fittingly inserted in the supply passage 113 enables gas flowing thereinto from the inlet port 321a provided at one end thereof on the side of the gas introduction section 31 to flow out from the outlet port 322a provided at the other end on the side opposite from the gas introduction section 31. Further, when viewed in a first direction (see the arrowed line AR0 in FIG. 2B) extending from the inside of the chamber body 11 toward the supply passage 113, the outlet port 322a and the inlet port 321a are offset from each other in a direction (second direction) orthogonal to the first direction AR0. Therefore, gas introduced from the supply passage 113 into the first member 321 through the inlet port 321a, as indicated by the arrowed line AR1 in FIG. 2B, is discharged into the chamber body 11 through the at least one outlet port 322a of the second member 322, as indicated by the arrowed line AR2 in FIG. 2B. It should be noted that this arrangement is the same even in the exemplary embodiment in which only one outlet port 322a is provided.

The gas introduction section 31 is connected to the supply passage 113 from outside the chamber body 11, and is capable of introducing gas into the chamber body 11 via the supply passage 113. The gas introduction section 31 is a gas supply source which is connected, for example, to a cylinder (bomb) storing therein PH3 (phosphine), AsH3 (arsine) or the like, and configured to supply gas stored in the cylinder to the chamber of the chamber body 11.

Figure 5:
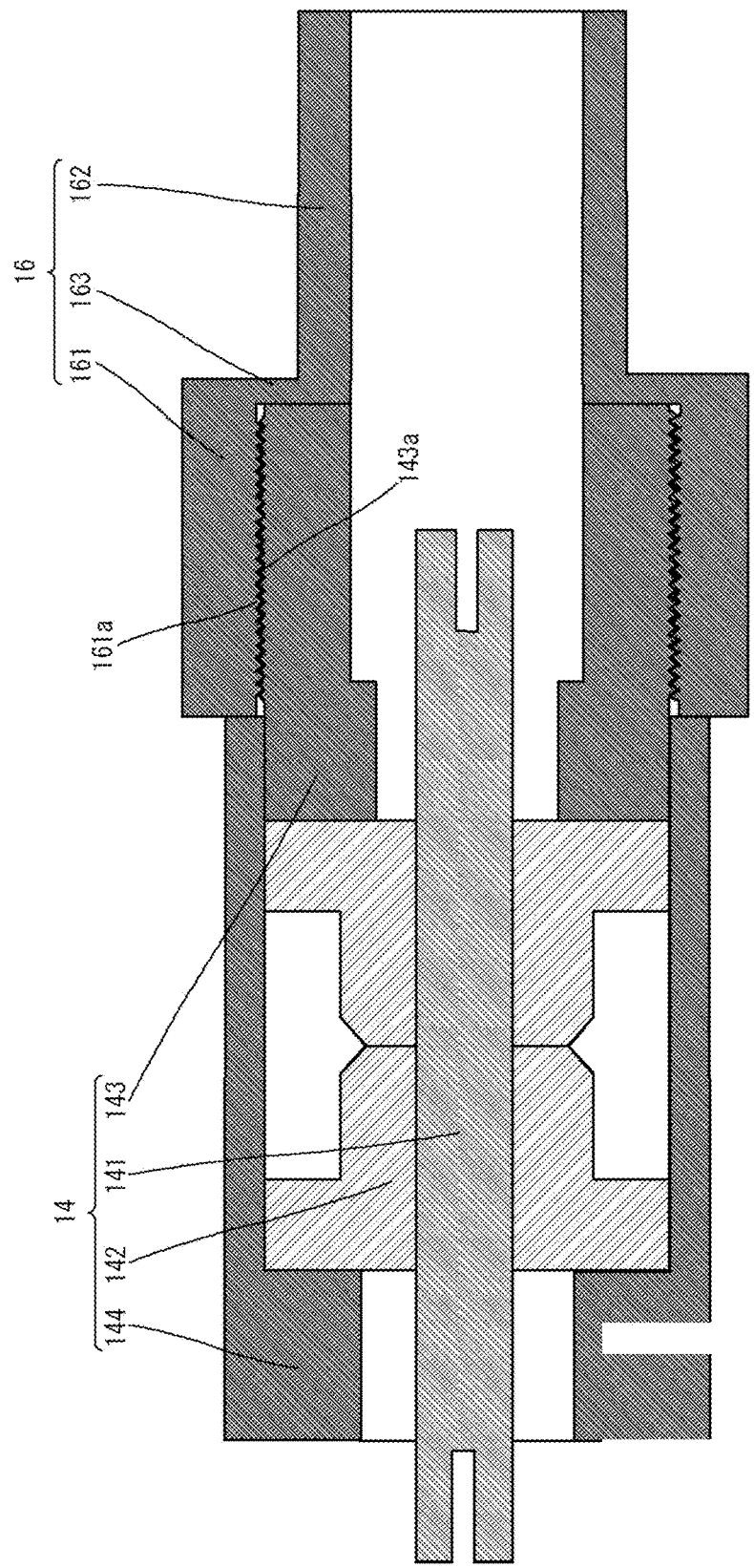
FIG. 5 is a sectional view depicting a connector and a conductor member of the plasma source of FIG. 1.

Each of the vacuum connectors 14 comprises an elongated pin 141; a holding member 142 formed from an insulator and holding a longitudinal central portion of the pin 141; and a tubular member 143 formed from an electroconductive material and formed into a circular tubular shape. The pin 141 is disposed inside the tubular member 143. Each vacuum connector 14 also comprises a sealing member 144 formed from a metal material. The sealing member 144 is disposed to cover an outer side of the holding member 142, and welded to the peripheral wall 111 of the chamber body 11 during an operation of burying the connector 14 in the peripheral wall 111 of the chamber body 11, to thereby seal between the holding member 142 and the peripheral wall 111. As depicted in FIG. 5, the tubular member 143 is provided with an externally threaded section 143a on an outer wall surface thereof. The pin 141 is formed such that a distal end thereof has a so-called "slotted head".

Thus, each of the antennas 15 is attached such that the base end 15a of the antenna 15 is clamped by the slotted head of the pin 141.

Returning to FIG. 1, the antenna 15 is a slender columnar antenna which extends inside the chamber body 11 toward the opening 11a. The first insulator member 21 covers the first region P1 of the antenna 15 located inside the chamber body 11 and on the side of the distal end 15b of the antenna 15, as mentioned above. By providing the first insulator member 21 to cover the first region P1 of the antenna 15, it becomes possible to prevent the first region P1 of the antenna 15 from being exposed to plasma generated inside the chamber body 11, and thus prevent wear of the first region P1 of the antenna 15 due to the plasma.

The first insulator member 21 comprises a plurality of insulator blocks 211 (in FIG. 1, five insulator blocks 211) arranged along a longitudinal direction of the antenna 15, and an insulator cap 212 formed from an insulator and covering the distal end 15b of the antenna 15. Each of the insulator blocks 211 and the insulation cap 212 is formed from a dielectric material such as Al2O3 (alumina), SiO2 (silicon oxide) or BN (boron nitride). The insulation cap 212 and each of the insulator blocks 211 may be formed from the same type of material, or may be formed from different types of materials, respectively. Further, the insulation cap 212 and each of the insulator blocks 211 may be formed, respectively, from materials each having the same permittivity, or may be formed, respectively, from materials each having a different permittivity. It should be noted that five insulator blocks 211 are shown in FIG. 1. However, this is only an example and fewer or more insulator blocks 211 may be provided. In other words, the number of insulator blocks 211 is not particularly limited. Additionally, in some exemplary embodiments, each of the insulator blocks 211 may be of a uniform length, whereas in other exemplary embodiments, one or more of the insulator blocks 211 may have a different length. For example, in the exemplary embodiment shown in FIG. 1 the most distal insulator block is longer in the longitudinal (i.e., axial) direction than the other insulator blocks.

Figure 3A:
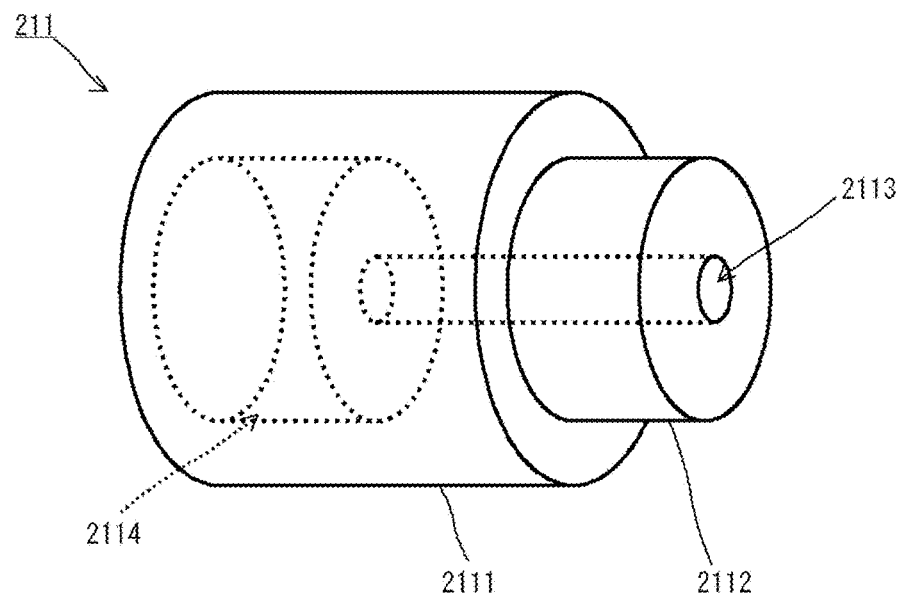
FIG. 3A is a perspective view of an insulator block of the plasma source of FIG. 1.
Figure 3B:
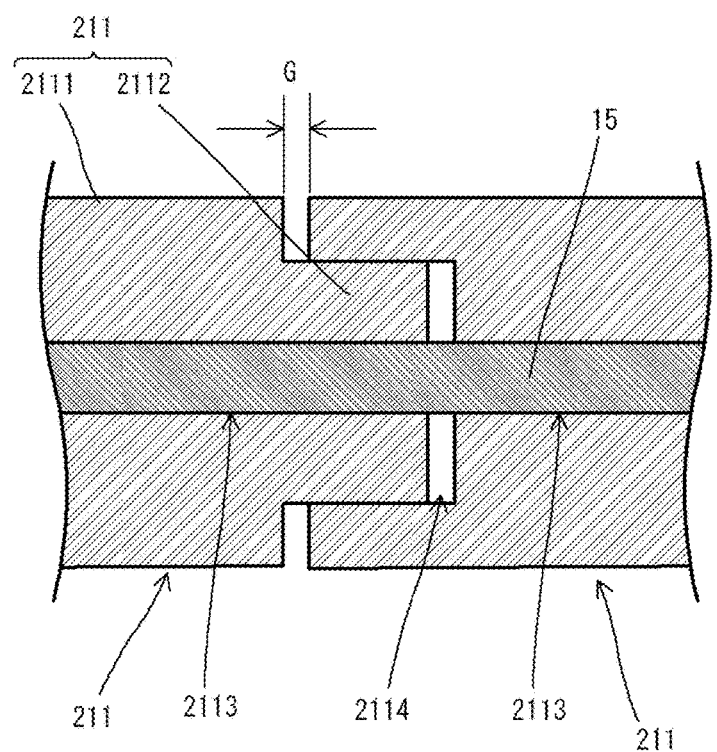
FIG. 3B is a fragmentary sectional view depicting two adjacent insulator blocks and an antenna of the plasma source of FIG. 1.
Figure 4A:
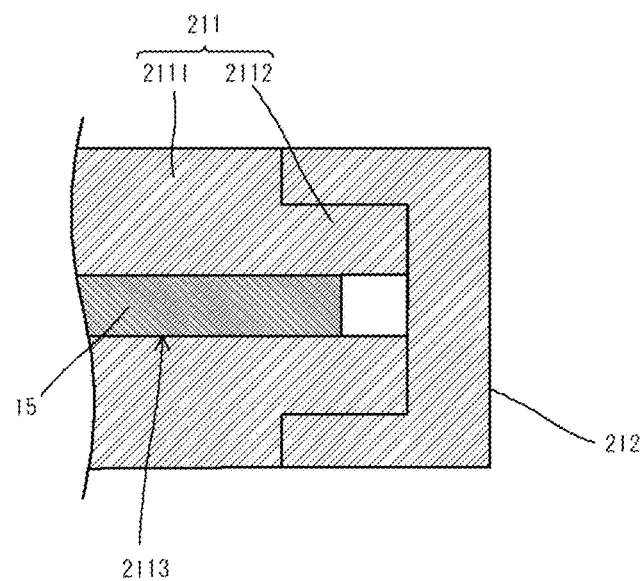
FIG. 4A is a sectional view depicting an insulator cap of the plasma source of FIG. 1.

As depicted in FIG. 3A, each of the insulator blocks 211 comprises a body portion 2111 having a columnar outer shape, and a columnar, small-diameter portion 2112 which is continuous with one of longitudinally opposite ends of the body portion 2111 and whose outer diameter is less than that of the body portion 2111. The body portion 2111 is provided with a cross-sectionally circular recess 2114 at the other end thereof from the small-diameter portion 2112. The body portion 2111 and the small-diameter portion 2112 are provided with a through-hole 2113 penetratingly extending from a bottom of the recess 2114 of the body portion 2111 to an end face of the small-diameter portion 2112 on the side opposite from the body portion 2111. Then, as depicted in FIG. 1, except for two insulator blocks 211 located, respectively, at longitudinally opposite ends of the antenna 15, among the plurality of insulator blocks 211, the small-diameter portion 2112 of one of two insulator blocks 211 adjacent to each other in the longitudinal direction of the antenna 15 is fittingly inserted into the recess 2114 of the other insulator block 211. In this state, the first region P1 of the antenna 15 may be defined as the length of the through-holes 2113 of insulator blocks 211 that have been inserted into each other in the assembled insulator blocks 211. Thus, for example, with the configuration shown in FIG. 3A and the arrangement shown in FIG. 1, even when a gap G occurs between two insulator blocks 211 adjacent to each other in the longitudinal direction of the antenna 15, as depicted in FIG. 3B, it becomes possible to prevent a situation where the antenna 15 is exposed to plasma inside the chamber body 11. As depicted in FIG. 4A, the insulator cap 212 is a bottomed circular tubular cap into which the small-diameter portion 2112 of an adjacent one of the insulator blocks 211 is fittingly inserted.

Figure 4B:
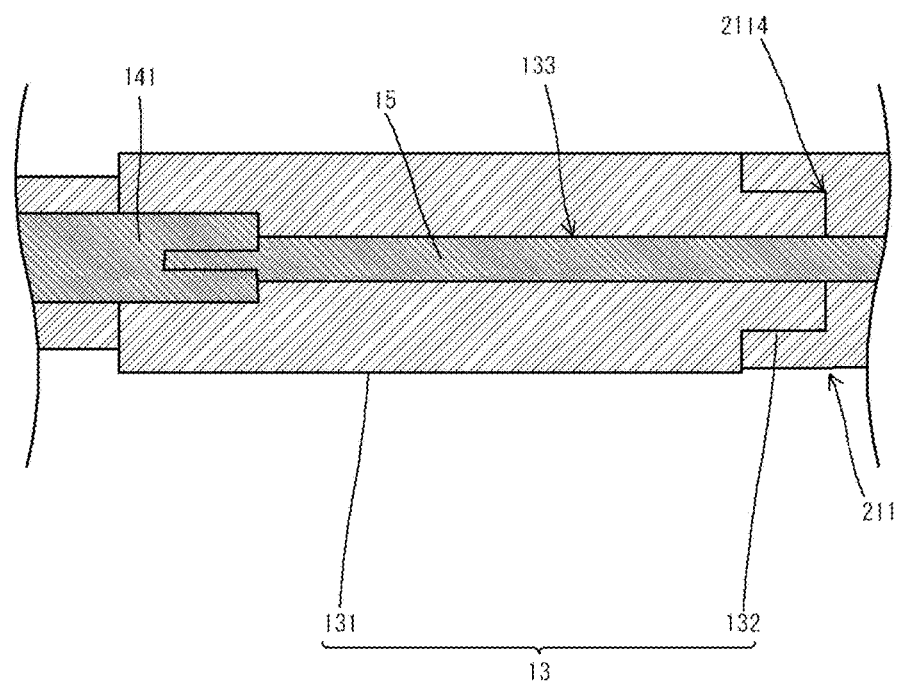
FIG. 4B is a sectional view of a second insulator member of the plasma source of FIG. 1.

Returning to FIG. 1, the second insulator member 13 covers the second region P2 of the antenna 15 located inside the chamber body 11 and on the side of the base end 15a (i.e., the proximal end) of the antenna 15, as mentioned above. The second insulator member 13 is also formed from a dielectric material such as SiO2 (silicon oxide) or BN (boron nitride). The second insulator member 13 may be formed from the same material as that of the insulator blocks 211, or may be formed from a material different from that of the insulator blocks 211. Further, the second insulator member 13 may be formed from a material having the same permittivity as that of a material for the insulator blocks 211, or may be formed from a material having a permittivity different from that of a material for the insulator blocks 211. As depicted in FIG. 4B, the second insulator member 13 comprises a body portion 131 having a columnar outer shape, and a columnar, small-diameter portion 132 which is continuous with one of longitudinally opposite ends of the body portion 131 and whose outer diameter is less than that of the body portion 131. The body portion 131 and the small-diameter portion 132 are provided with a through-hole 133 penetratingly extending from an end of the body portion 131 to an end face of the small-diameter portion 132 on the side opposite from the body portion 131. Then, the small-diameter portion 132 of the second insulator member 13 is fittingly inserted into the recess 2114 of the insulator block 211 adjacent thereto in the longitudinal direction of the antenna 15. In this state, the second region P2 of the antenna 15 is inserted in the through-holes 133 of the of the second insulator member 13.

The conductor member 16 covers the second insulator member 13, as mentioned above. Thus, a combination of the conductor member 16, the second insulator member 13 and the second region P2 of the antenna 15 forms a so-called "coaxial structure". For example, the conductor member 16 is formed from a metal material having high heat resistance, such as stainless steel. Further, an outer wall surface of the conductor member 16 is covered by a circular tubular insulating member 23. The insulating member 23 is formed from a ceramic material such as Al2O3 (alumina), BN (boron nitride) or AlN (aluminum nitride).

As depicted in FIG. 5, the conductor member 16 comprises a circular tubular body portion 161, a circular tubular, small-diameter portion 162 having an outer diameter less than that of the body portion 161, and an annular portion 163 lying between the body portion 161 and the small-diameter portion 162. The conductor member 16 is provided with an internally threaded section 161a on an inner wall surface of the body portion 161. The internally threaded section 161 is threadingly engaged with the externally threaded section 143a provided on the outer wall surface of the tubular member 143 of the vacuum connector 14. A distal end face of the tubular member 143 of the vacuum connector 14 is in contact with one surface of the annular portion 163 on the side of the vacuum connector 14. Further, as depicted in FIG. 1, the insulating member 23 is in contact with the other surface of the annular portion 163 on the side opposite to the vacuum connector 14.

In the exemplary embodiment shown in FIGS. 1 and 5, an impedance between the second region P2 of the antenna 15 and the conductor member 16 is equal to an impedance between an inner conductor and an outer conductor of the coaxial cable 41 connected to the vacuum connector 14. Specifically, an inner diameter of the conductor member 16, a specific permittivity of the second insulator member 13 and an outer diameter of the second region P2 of the antenna 15 are selected such that the impedance between the second region P2 and the conductor member 16 becomes equal to the impedance between the inner conductor and the outer conductor of the coaxial cable 41 connected to the vacuum connector 14.

As described above, the plasma source 1 comprises the antenna 15, the first insulator member 21, the second insulator member 13 and the conductor member 16. The base end 15a of the antenna 15 is connected to the vacuum connector 14, and, in this state, the antenna 15 extends inside the chamber body 11 toward the opening 11a of the chamber body 11. The first insulator member 21 covers the first region P1 of the antenna 15, and the second insulator member 13 covers the second region P2 of the antenna 15. Further, the conductor member 16 covers the second insulator member 13. In this way, the combination of the conductor member 16, the second insulator member 13 and the second region P2 of the antenna 15 forms a coaxial structure. Thus, due to the presence of the conductor member 16, the density of plasma to be generated inside the chamber body 11 in a region around the second region P2 of the antenna 15 is reduced, and the density of plasma to be generated inside the chamber body 11 in a region closer to the opening 11a than that around the second region P2 is increased. Therefore, ions or electrons to be generated inside the chamber body 11 in a region close to the opening 11a are increased. Accordingly, there is an advantage of making it possible to improve extraction efficiency during operation of extracting ions or electrons generated inside the chamber body 11, to the outside of the chamber body 11 through the opening 11a by the extraction electrode 17.

In the plasma source 1, the vacuum connector 14 comprises the tubular member 143 provided with the externally threaded section 143a on the outer wall surface thereof, and the conductor member 16 comprises the body portion 161 provided with the internally threaded section 161a on the inner wall surface thereof, wherein the internally threaded section 161a is threadingly engaged with the externally threaded section 143a. Thus, the conductor member 16 can be strongly fixed to the vacuum connector 14 with detachability with respect to the vacuum connector 14, so that it becomes possible to suppress leakage of microwave energy from a gap between the vacuum connector 14 and the conductor member 16, and improve maintenance of the conductor member 16. Further, a set of the conductor member 16 and the second insulator member 13 can be replaced with another set of the conductor member and the second insulator member different in length. This ability provides an advantage of making it easy to adjust a density distribution of plasma to be generated inside the chamber body 11.

In the plasma source 1, the impedance between the second region P2 of the antenna 15 and the conductor member 16 is equal to the impedance between the inner conductor and the outer conductor of the coaxial cable 41. This impedance match makes it possible to reduce a reflection of a microwave supplied from the coaxial cable 41 to the antenna 15, in the second region P2 of the antenna 15, and thus reduce a microwave loss.

In the plasma source 1, the first insulator member 21 comprises the plurality of insulator blocks 211 arranged along the longitudinal direction of the antenna 15. Thus, when the first insulator member 21 is partially worn due to plasma, there is an advantage in that it is possible to replace only one or more of the insulator blocks 211 corresponding to the worn part. Therefore, it becomes possible to reduce a component cost, as compared to the case of replacing the entire first insulator member 21.

In the plasma source 1, when viewed in the first direction AR0 extending from the inside of the chamber body 11 toward the supply passage 113 (see FIG. 2B), each of the outlet ports 322a and the inlet port 321a are offset from each other in the second direction orthogonal to the first direction. Thus, an inner wall surface of the supply passage 113 is less likely to be exposed to plasma generated inside the chamber body 11, so that it becomes possible to prevent a situation where metal atoms exposed to the inner wall surface of the supply passage 113 are sputtered and released to the outside the chamber body 11.

While the present inventive concept has been described by way of various exemplary embodiments, it should be noted that the present inventive concept is not limited to the above exemplary embodiments in any way. For example, the plasma source may comprise a magnet or a solenoid coil disposed to surround the chamber body 11, wherein the plasma source may be configured to generate a magnetic field inside the chamber body 11. Alternatively, the plasma source may comprise two solenoid coils and a multipolar magnet which are arranged to surround the chamber body 11, wherein the plasma source is configured to generate a cusp-shaped magnetic field inside the chamber body 11.

Although the above exemplary embodiments have been described based on an example in which the plasma source comprises two antennas 15, the number of the antennas 15 is not limited to two. For example, the plasma source may comprise only one antenna 15 or may comprise three or more antennas 15.

Although the above exemplary embodiments have been described based on an example in which the first insulator member 21 comprises the plurality of insulator blocks 211, the present inventive concept is not limited thereto. For example, the first insulator member 21 may comprise a single insulator block covering the entire first region P1 of the antenna 15. Further, the number of the insulator blocks 211 of the first insulator member 21 is not limited to five, but may be six or more, or may be four or less.

The above exemplary embodiments have been described based on an example in which the impedance between the second region P2 of the antenna 15 and the conductor member 16 becomes equal to the impedance between the inner conductor and the outer conductor of the coaxial cable 41. However, the present inventive concept is not limited thereto, and in some exemplary embodiments the impedance between the second region P2 of the antenna 15 and the conductor member 16 may be different from the impedance between the inner conductor and the outer conductor of the coaxial cable 41.

Although the above exemplary embodiments have been described based on an example in which the insulator layer 112 and the insulating member 23 are formed from a ceramic material, a material for each of the insulator layer 112 and the insulating member 23 is not limited to a ceramic material, but may be formed, for example, from a carbonaceous material.

In the above exemplary embodiments, the vacuum connector 14 may comprise a tubular member having no externally threaded section on an outer wall surface thereof, and the conductor member 16 comprises a body portion having no internally threaded section on an inner wall surface thereof.

The above exemplary embodiments have been described based on an example in which the supply passage 113 has the main portion 113a, and the broadened portion 113b which is formed at one end of the supply passage 113 on the side opposite from the side of the gas introduction section 31, and is broader than the main portion 113a. However, the shape of the supply passage is not limited thereto. For example, the supply passage may have a constant breadth over the overall length thereof.

In the above exemplary embodiments, a 13.56 MHz high-frequency wave may be supplied from a high-frequency source (not depicted) to the antenna 15 via the coaxial cable 41.

The above exemplary embodiments have been described based on an example in which the pin 141 is formed with a so-called "slotted head" at the distal end thereof, and the antenna 15 is attached to the pin 141 such that the base end 15a thereof is clamped by the slotted head. However, the structure for attaching the antenna 15 to the pin 141 is not limited thereto. For example, the base end 15a of the antenna 15 may be formed with a threaded section, and the distal end of the pin 141 may be formed with a threaded section threadingly engageable with the threaded section formed on the base end 15a of the antenna 15, wherein the antenna 15 may be attached to the pin 141 by threadingly engaging the threaded section on the base end 15a of the antenna 15 with the threaded section on the distal end of the pin 141.

While example embodiments have been described with reference to the accompanying drawings, it should be understood by those skilled in the art that various modifications may be made without departing from the scope of the present inventive concept. Therefore, the above-described exemplary embodiments should be considered in a descriptive sense only and not for purposes of limitation.

What is claimed is:

1. A plasma source comprising:
   a chamber body having an opening for emitting ions or electrons;
   a gas supply passage penetrating through a first peripheral wall of the chamber body;
   a vacuum connector provided in a second peripheral wall of the chamber body;
   an antenna having a base end connected to the vacuum connector, and extending inside the chamber body toward the opening;
   a first insulator covering a first region of the antenna at a distal end of the antenna inside the chamber body;
   a second insulator covering a second region of the antenna at the base end of the antenna inside the chamber body; and
   a conductor covering the second insulator.

2. The plasma source as recited in claim 1, wherein the first peripheral wall and the second peripheral wall are a same wall of the chamber body.

3. The plasma source as recited in claim 2, wherein the first peripheral wall and the second peripheral wall of the chamber body are both opposite from the opening.

4. The plasma source as recited in claim 1, wherein the first peripheral wall is a different wall of the chamber body from the second peripheral wall.

5. The plasma source as recited in claim 1, wherein the vacuum connector comprises:
   a pin;
   a holder formed from an insulator and holding the pin; and
   a tubular member formed from an electroconductive material and comprising a first threaded section on an outer wall surface thereof, the pin being disposed inside the tubular member, and
   wherein the conductor comprises a second threaded section on an inner wall surface thereof, the second threaded section being threadingly engaged with the first threaded section.

6. The plasma source as recited in claim 5, wherein the vacuum connector has one end to which the antenna is connected, and another end to which a coaxial cable is connected, wherein a first impedance between the second region and the conductor is equal to a second impedance between an inner conductor and an outer conductor of the coaxial cable.

7. The plasma source as recited in claim 6, wherein the first insulator comprises a plurality of insulator blocks arranged along a longitudinal direction of the antenna.

8. The plasma source as recited in claim 7, further comprising:
   a fitted member fitted into the supply passage, the fitted member having an inlet port through which gas flows into the fitted member and at least one outlet port through which gas flows out of the fitted member,
   wherein, when viewed in a first direction from the chamber body toward the supply passage, the at least one outlet port and the inlet port are offset from each other in a second direction orthogonal to the first direction.

9. The plasma source as recited in claim 6, further comprising:
   a fitted member fitted into the supply passage, the fitted member having an inlet port through which gas flows into the fitted member and at least one outlet port through which gas flows out of the fitted member,
   wherein, when viewed in a first direction from the chamber body toward the supply passage, the at least one outlet port and the inlet port are offset from each other in a second direction orthogonal to the first direction.

10. The plasma source as recited in claim 5, wherein the first insulator comprises a plurality of insulator blocks arranged along a longitudinal direction of the antenna.

11. The plasma source as recited in claim 10, further comprising:
    a fitted member fitted into the supply passage, the fitted member having an inlet port through which gas flows into the fitted member and at least one outlet port through which gas flows out of the fitted member,
    wherein, when viewed in a first direction from the chamber body toward the supply passage, the at least one outlet port and the inlet port are offset from each other in a second direction orthogonal to the first direction.

12. The plasma source as recited in claim 5, further comprising:
    a fitted member fitted into the supply passage, the fitted member having an inlet port through which gas flows into the fitted member and at least one outlet port through which gas flows out of the fitted member,
    wherein, when viewed in a first direction from the chamber body toward the supply passage, the at least one outlet port and the inlet port are offset from each other in a second direction orthogonal to the first direction.

13. The plasma source as recited in claim 1, wherein the vacuum connector has one end to which the antenna is connected, and another end to which a coaxial cable is connected, wherein a first impedance between the second region and the conductor is equal to a second impedance between an inner conductor and an outer conductor of the coaxial cable.

14. The plasma source as recited in claim 13, further comprising:
   a fitted member fitted into the supply passage, the fitted member having an inlet port through which gas flows into the fitted member and at least one outlet port through which gas flows out of the fitted member,
   wherein, when viewed in a first direction from the chamber body toward the supply passage, the at least one outlet port and the inlet port are offset from each other in a second direction orthogonal to the first direction.

15. The plasma source as recited in claim 1, wherein the vacuum connector has one end to which the antenna is connected, and another end to which a coaxial cable is connected, wherein a first impedance between the second region and the conductor is different from a second impedance between an inner conductor and an outer conductor of the coaxial cable.

16. The plasma source as recited in claim 1, wherein the first insulator comprises a plurality of insulator blocks arranged along a longitudinal direction of the antenna.

17. The plasma source as recited in claim 10, further comprising:
   a fitted member fitted into the supply passage, the fitted member having an inlet port through which gas flows into the fitted member and at least one outlet port through which gas flows out of the fitted member,
   wherein, when viewed in a first direction from the chamber body toward the supply passage, the at least one outlet port and the inlet port are offset from each other in a second direction orthogonal to the first direction.

18. The plasma source as recited in claim 1, further comprising:
   a fitted member fitted into the supply passage, the fitted member having an inlet port through which gas flows into the fitted member and at least one outlet port through which gas flows out of the fitted member,
   wherein, when viewed in a first direction from the chamber body toward the supply passage, the at least one outlet port and the inlet port are offset from each other in a second direction orthogonal to the first direction.

19. A plasma source comprising:
   a chamber body having an opening for emitting ions or electrons, and a wall opposite to the opening, a chamber being defined between the wall and the opening;
   a gas supply passage penetrating through the chamber body;
   a vacuum connector provided in the wall and having a portion extending into the chamber;
   an antenna connected to the vacuum connector, and having an extension portion that extends into the chamber;
   a first insulator covering a distal end of the extension portion of the antenna;
   a second insulator covering a proximal end of the extension portion of the antenna between the wall and the first insulator; and
   a conductor coaxially covering the second insulator.

20. The plasma source as recited in claim 19, wherein the gas supply passage penetrates through the wall of the chamber body.

* * * * *